(12) United States Patent
Park et al.

(10) Patent No.: US 8,007,218 B2
(45) Date of Patent: Aug. 30, 2011

(54) UNIT AND METHOD FOR TRANSFERRING SUBSTRATES AND APPARATUS AND METHOD FOR TREATING SUBSTRATES WITH THE UNIT

(75) Inventors: Dong-Seok Park, Hwaseong-si (KR); Sang-Ho Seol, Hwaseong-si (KR)

(73) Assignee: PSK Inc., Gyeonggi-do (KR)

( * ) Notice: Subject to any disclaimer, the term of this patent is extended or adjusted under 35 U.S.C. 154(b) by 0 days.

(21) Appl. No.: 12/458,098

(22) Filed: Jun. 30, 2009

(65) Prior Publication Data

US 2009/0280001 A1    Nov. 12, 2009

Related U.S. Application Data

(60) Division of application No. 11/892,224, filed on Aug. 21, 2007, now abandoned, which is a continuation-in-part of application No. 11/655,182, filed on Jan. 19, 2007, now abandoned.

(30) Foreign Application Priority Data

May 2, 2007    (KR) .......................... 10-2007-0042599

(51) Int. Cl.
*H01L 21/677* (2006.01)
(52) U.S. Cl. ........ 414/217; 414/805; 414/806; 414/935; 414/939
(58) Field of Classification Search .................. 414/217, 414/744.5, 805, 806, 935, 939
See application file for complete search history.

(56) References Cited

U.S. PATENT DOCUMENTS

| | | | |
|---|---|---|---|
| 6,634,845 B1 | 10/2003 | Komino | |
| 6,669,434 B2 | 12/2003 | Namba et al. | |
| 6,737,826 B2 | 5/2004 | Gilchrist | |
| 6,737,829 B2 | 5/2004 | Sastry | |
| 7,086,822 B2 | 8/2006 | Maeda | |
| 7,618,226 B2 * | 11/2009 | Takizawa et al. | ........ 414/416.08 |
| 2002/0061248 A1 | 5/2002 | Tepman | ..................... 414/744.5 |
| 2003/0011338 A1 | 1/2003 | Gilchrist | |
| 2005/0079042 A1 | 4/2005 | Maeda | |
| 2005/0217053 A1 | 10/2005 | Kim et al. | .................. 15/250.21 |
| 2005/0220576 A1 | 10/2005 | Kim et al. | ..................... 414/217 |

FOREIGN PATENT DOCUMENTS

| | | |
|---|---|---|
| CN | 1617789 | 5/2005 |
| JP | 5-021579 | 1/1993 |
| JP | 7-326654 | 12/1995 |
| JP | 10-275848 | 10/1998 |
| JP | 2000-133690 | 12/2000 |
| JP | 2001-135698 | 5/2001 |
| JP | 2002-158272 | 5/2002 |
| JP | 2002-184834 | 6/2002 |
| JP | 2003-170384 | 6/2003 |

(Continued)

*Primary Examiner* — Michael S Lowe
(74) *Attorney, Agent, or Firm* — Harness, Dickey & Pierce, P.L.C.

(57) ABSTRACT

The present invention is related to a method for transferring substrates. The method comprise simultaneously transferring two substrates, by means of a transfer unit, between first support plates disposed to be vertically spaced apart from each other and second support plates arranged abreast in a lateral direction. The transfer unit comprises a top blade and a bottom blade converted to a folded state where they are vertically disposed to face each other and an unfolded state where they rotate at a preset angle in opposite directions. The transfer unit place/take a substrate on/out of the first support plates under the folded state and place/take a substrate on/out of the second support plates under the unfolded state.

14 Claims, 18 Drawing Sheets

| | FOREIGN PATENT DOCUMENTS | |
|---|---|---|
| JP | 2003-264215 | 9/2003 |
| JP | 2004-288719 | 10/2004 |
| JP | 2004-535072 | 11/2004 |
| JP | 2007-5582 | 1/2007 |
| JP | 2008-016815 | 1/2008 |
| JP | 2008-135630 | 6/2008 |
| KR | 10-2005-0061925 | 6/2005 |
| KR | 10-2005-0092278 | 9/2005 |
| KR | 1020050092278 * | 9/2005 |

* cited by examiner

UNIT AND METHOD FOR TRANSFERRING SUBSTRATES AND APPARATUS AND METHOD FOR TREATING SUBSTRATES WITH THE UNIT

CROSS-REFERENCE TO RELATED APPLICATIONS

This application is a Divisional of U.S. application Ser. No. 11/892,224, filed on Aug. 21, 2007 now abandoned, which is a continuation-in-part application of U.S. patent application Ser. No. 11/655,182 filed on Jan. 9, 2007 now abandoned, and which claims priority under 35 U.S.C §119 to Korean Patent Application 2007-42599 filed on May 2, 2007, the entirety of each of which are hereby incorporated by reference.

BACKGROUND

The present invention relates to apparatuses and methods for use in manufacturing semiconductor substrates. More specifically, the present invention is directed to unit and method for transferring substrates and apparatus and method for treating substrates with the unit.

In recent years, cluster-type apparatuses are increasingly used to manufacture semiconductor devices. A cluster-type apparatus has a configuration where a loadlock chamber and process chambers are disposed around a transfer chamber. Generally, wafers are placed in a loadlock chamber and vertically spaced to face each other. Two chucks, on which substrates are to be mounted, are provided inside one process chamber and disposed abreast in a side direction.

A transfer unit is provided at a transfer chamber to transfer a wafer between a loadlock chamber and a process chamber and between one process chamber and another process chamber. Since the transfer unit has only one blade on which a wafer is placed, only one wafer can be transferred at one time. In order to mount wafers on their respective chucks, a transfer unit must carry wafers between a loadlock chamber and a process chamber twice. Thus, it takes much time to transfer wafers. In the case where two robots operating independently may be provided at a transfer chamber, an occupied area of the transfer chamber increases due to the two robots. Further, since the two robots cannot enter one loadlock chamber at the same time, one robot must wait until the other robot takes a wafer out of a loadlock chamber.

In addition, a typical transfer unit includes only one holding part where a wafer is placed on a blade. After taking a processed wafer out of a process chamber and putting the wafer into a loadlock chamber, a blade takes another wafer out of the loadlock chamber and carries the wafer to the process chamber. Accordingly, until a process for the next wafer is performed inside a process chamber after a process for a wafer is performed, much time is required for transferring a wafer to significantly decrease a treating amount of the process chamber.

SUMMARY OF THE INVENTION

Exemplary embodiments of the present invention are directed to a unit for transferring substrates. In an exemplary embodiment, the unit may include: a blade member on which a substrate is placed; an arm member coupled with the blade member to carry the blade member; and a driving member configured to supply a driving force to the blade member or the arm member, wherein the blade member comprises: a bottom blade; and a top blade disposed over the bottom blade to change a relative position with respect to the bottom blade.

In another exemplary embodiment, the unit may include: a top blade including at least two support parts on which a substrate is placed; and a bottom blade including at least two support parts on which a substrate is placed, the bottom blade being disposed below the top blade, wherein the top and bottom blades are carried by means of one arm member, and wherein the top and bottom blades are provided to be converted to a folded state where they vertically face each other and an unfolded state where they are widened at a preset angle.

Exemplary embodiments of the present invention are directed to an apparatus for treating substrates. In an exemplary embodiment, the apparatus may include: a transfer chamber; at least one process chamber disposed at one side of the transfer chamber; a loadlock chamber, disposed at the other side of the transfer chamber, in which substrate are placed to be vertically spaced apart from each other; and a transfer unit provided at the transfer chamber to transfer substrates between the loadlock chamber and the process chamber, wherein the transfer unit comprises: a blade member on which a substrate is placed; an arm member coupled with the blade member to carry the blade member; and a driving member configured to supply a driving force to the blade member and the arm member, and wherein the blade member comprises: a bottom blade; and a top blade disposed over the bottom blade, wherein the bottom and top blades are provided to change their relative positions.

Exemplary embodiments of the present invention are directed to a method for transferring substrates. In an exemplary embodiment, the method may include: simultaneously transferring two substrates, by means of a transfer unit, between first support plates disposed to be vertically spaced apart from each other and second support plates arranged abreast in a lateral direction, wherein a transfer unit comprises a top blade and a bottom blade converted to a folded state where they are vertically disposed to face each other and an unfolded state where they rotate at a preset angle in opposite directions to place/take a substrate on/out of the first support plates under the folded state or place/take a substrate on/out of the second support plates under the unfolded state.

Exemplary embodiments of the present invention are directed to a method for treating substrates. In an exemplary embodiment, the method may include: treating a substrate by means of a substrate treating apparatus including a transfer chamber; at least one process chamber disposed at one side of the transfer chamber; a loadlock chamber, disposed at the other side of the transfer chamber, in which substrate are placed to be vertically spaced apart from each other; and a transfer unit provided at the transfer chamber to transfer substrates between the loadlock chamber and the process chamber, wherein substrates are placed in the loadlock chamber to be vertically spaced to face each other, and substrates are placed in the process chamber to be arranged abreast in a lateral direction, wherein the transfer unit comprises a top blade and a bottom blade converted to a folded state where they vertically face each other and an unfolded state where they rotate at a preset angle in opposite directions, and wherein the transfer unit puts/takes a substrate into/out of the loadlock chamber under the folded state and puts/takes a substrate into/out of the process chamber under the unfolded state.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In top plan views among the drawings, a hidden one of two vertically overlapped wafers is drawn by a dotted line and a hidden one of two vertically overlapped blades is also drawn by a dotted line.

While a substrate treating apparatus having a cluster-type structure will be described in the embodiments, the present invention is not limited thereto and a transfer unit according to the present invention may be applied to apparatuses having various structures.

In addition, while a wafer for manufacturing semiconductor chips will be described in the embodiments as a workpiece transferred by a transfer unit, the workpiece is not limited to the wafer and may be various objects (e.g., glass substrate) having various plate shapes.

Figure 1:
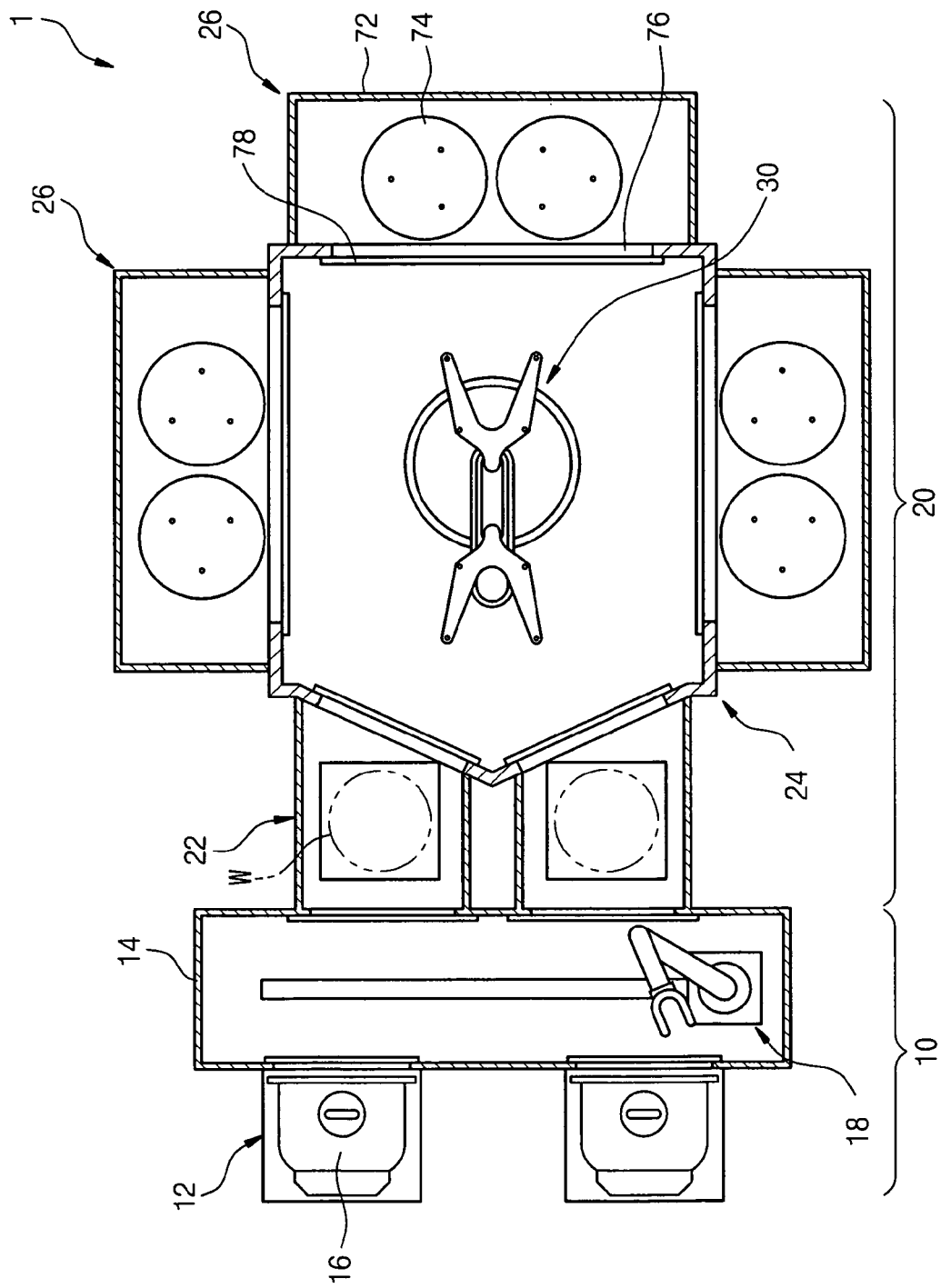
FIG. 1 is a top plan view of a substrate treating apparatus according to an embodiment of the present invention.

FIG. 1 is a top plan view of a substrate treating apparatus 1 according to an embodiment of the present invention. The substrate treating apparatus 1 includes an equipment front end module 10 and a process equipment 20.

The equipment front end module 10 is installed in front of the process equipment 20 to carry a wafer W between the process equipment 20 and a container 16 in which wafers W are housed. The equipment front end module 10 includes a plurality of loadports 12 and a frame 14. The container 16 is located on the loadport 12 by transporting means (not shown) such as an overhead transfer, an overhead conveyor or an automatic guided vehicle. The container 16 may be a sealing container such as a front opened unified pod (FOUP). A frame robot 18 is installed inside the frame 14 to carry a wafer W between the process equipment 20 and the container 16 located on the loadport 12. A door opener (not shown) is installed inside the frame 14 to automatically open and close a door of the container 16. A fan filter unit (not shown) may be provided at the frame 14. The fan filter unit supplies clean air into the frame 14 to allow the clean air to flow from an upper portion to a lower portion in the frame 14.

The process equipment 20 includes a loadlock chamber 22, a transfer chamber 24, and a process chamber 26. The transfer chamber 24 exhibits a polygonal shape, when view from the upside. The loadlock chamber 22 or the process chamber 26 is disposed at the side surface of the transfer chamber 24.

The loadlock chamber 22 is disposed at a side portion adjacent to the equipment front end module 10, among side portions of the transfer chamber 24, and the process chamber 26 is disposed at another side portion. One or at least two loadlock chambers 22 are provided. In an exemplary embodiment, two loadlock chambers 22 are provided. Wafers W put into the process equipment 20 to perform a process may be contained in one loadlock chamber 22, and wafers W processed to be taken out of the process equipment 20 may be contained in the other loadlock chamber 22. Alternatively, one or at least two loadlock chambers 22 may be provided and a wafer may be loaded or unloaded at the respective loadlock chambers 22.

Inside the loadlock chamber 22, wafers are vertically spaced to face each other. A plurality of slots 22a may be provided at the loadlock chamber 22 to support a portion of a wafer edge region.

The insides of the transfer chamber 24 and the process chamber 26 are kept sealed, and the inside of the loadlock chamber 22 is converted to vacuum and atmospheric pressure. The loadlock chamber 22 prevents external contaminants from entering the transfer chamber 24 and the process chamber 26. A gate valve (not shown) is installed between the loadlock chamber 22 and the transfer chamber as well as between the loadlock chamber 22 and the equipment front end module 10. In the case where a wafer W is carried between the equipment front end module 10 and the loadlock chamber 22, the gate valve installed between the loadlock chamber 22 and the transfer chamber 24 is closed. In the case where a wafer W is carried between the loadlock chamber 22 and the transfer chamber 24, the gate valve installed between the loadlock chamber 22 and the equipment front end module 10 is closed.

A process chamber 26 is provided to perform a predetermined process for a wafer W. The predetermined process includes processes using plasma such as, for example, an ashing process, a deposition process, an etching process or a cleaning process. In the event that a plurality of process chambers 26 are provided, each of the process chambers 26 may perform the same process for a wafer W. Optionally in the event that a plurality of process chambers 26 are provided, they may perform a series of processes for a wafer W.

The process chamber 26 includes a housing 72, in which defined is a space where a process is performed, and a support member 74. The support member 74 is provided inside the housing 72 to support a wafer W during a process. The support member 74 may be configured to hold a wafer W by means of mechanical clamping or electrostatic force. Two support members 74 are provided inside the housing 72 and arranged alongside each other. An entrance 76 is formed at a region facing the transfer chamber 24, among the outer wall of the housing 72. A wafer W enters or exits through the entrance 76. The entrance 76 may be opened or closed by a door 78. The entrance 76 has a width enough to allow two wafers W to enter or exit at the same time. Optionally, entrances 76 may be provided with the same number as support members 74 provided inside the housing 72. Each of the entrances 76 may have a width enough to allow one wafer W to enter or exit. The support members 74 provided inside the housing 72 may increase in number.

Figure 2:
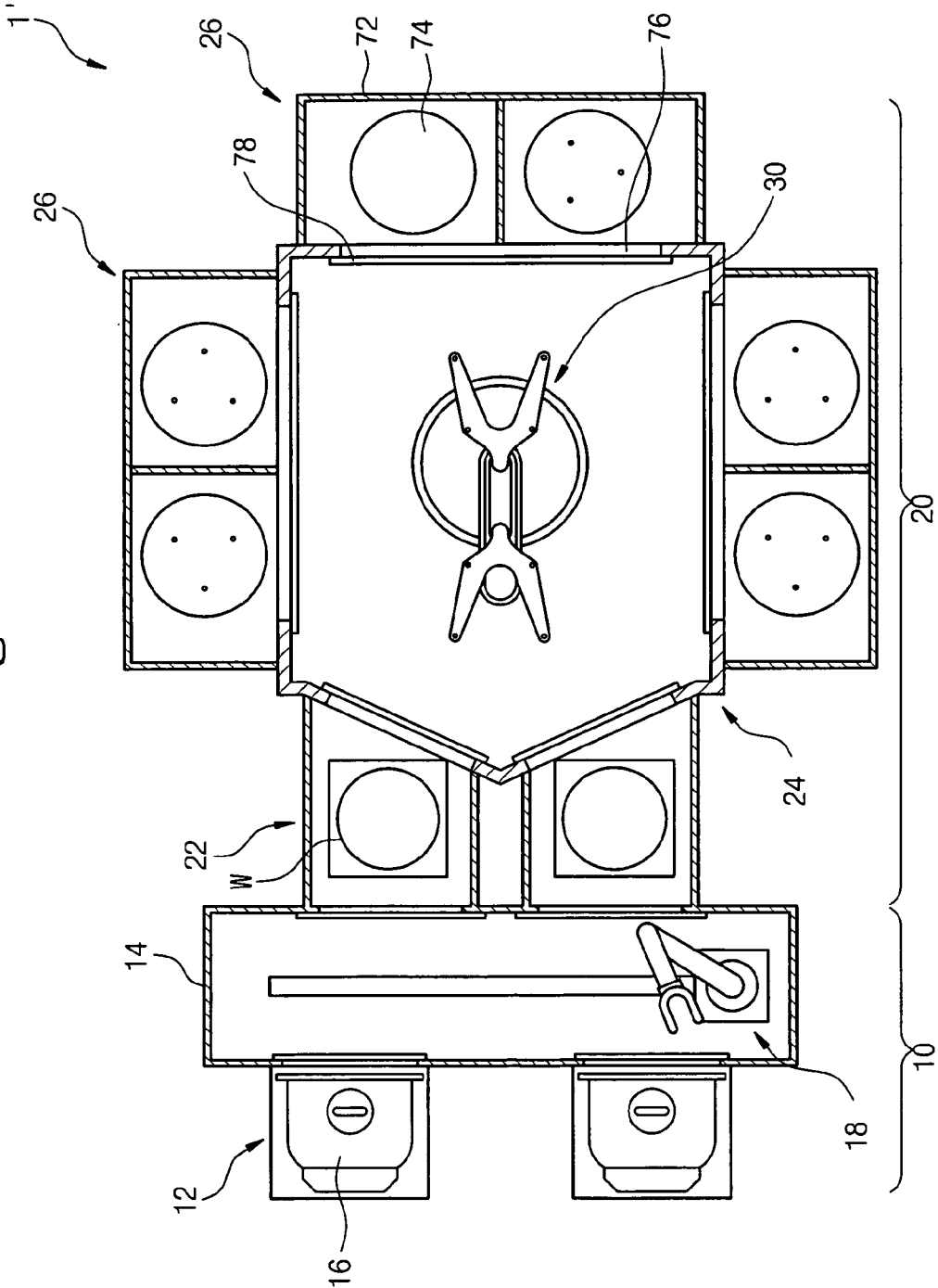
FIG. 2 is a top plan view of a modified example of the substrate treating apparatus illustrated in FIG. 1.

FIG. 2 illustrates another example 1' of the substrate treating apparatus 1 of FIG. 1. A process chamber 26 in the substrate treating apparatus 1' includes a housing 72 and a support member 74. One entrance 76 is provided at the housing 72, and one support member 74 is provided inside the housing 72. Among a plurality of process chambers 26, two process chambers 26 are arranged alongside each other to constitute one group. The entrance 76 may be opened or closed by a door 78. Entrances 76 provided at two process chambers 26 may be opened or closed by one door 78. Optionally, a door 78 may be provided at the respective process chambers 26.

Figure 3:
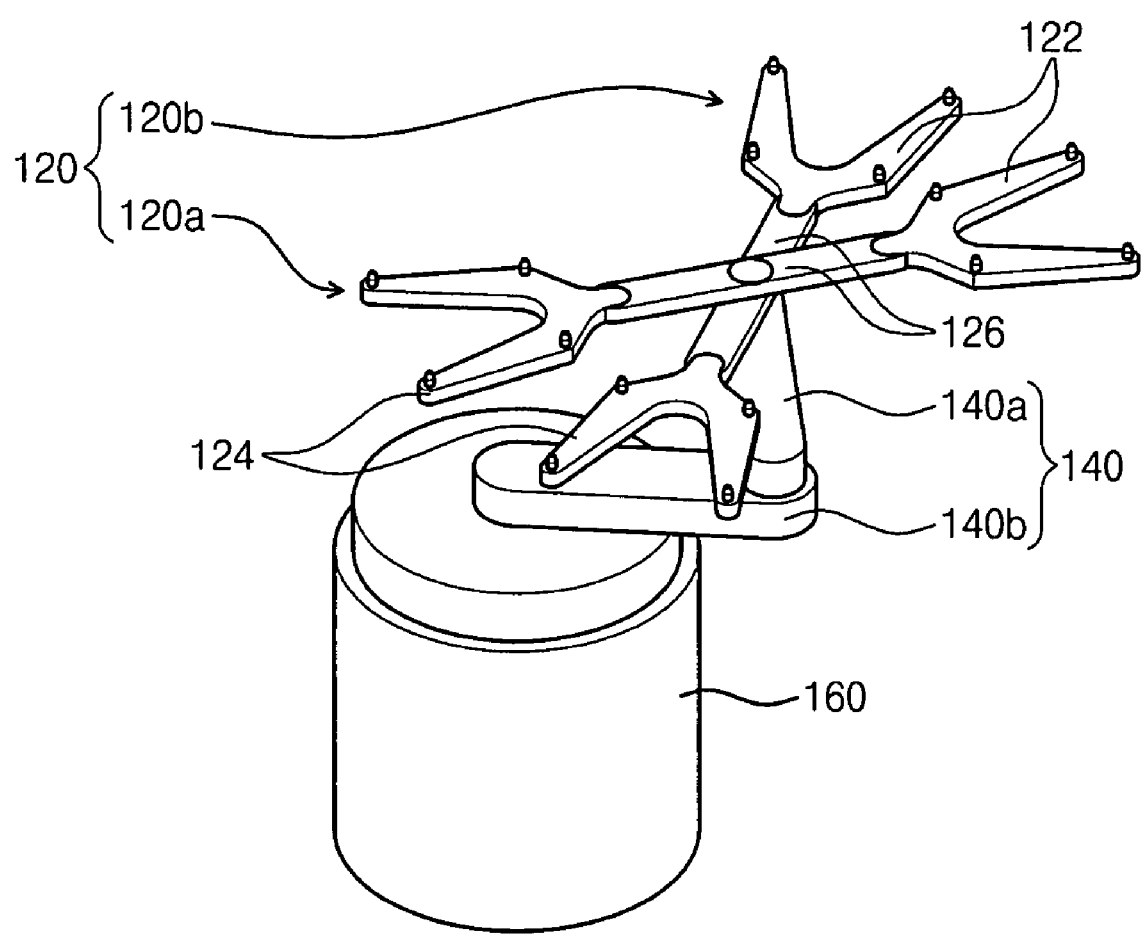
FIG. 3 is a perspective view of a substrate transfer unit illustrated in FIG. 1.

A transfer unit 30 is installed inside a transfer chamber 24, carrying a wafer W between a process chamber 26 and a loadlock chamber 22. In the case where a plurality of process chambers 26 are provided, the transfer unit 30 may carry a wafer W between the process chambers 26. As illustrated in FIG. 3, the transfer unit 30 includes a blade member 120, an arm member 140, a rotation body 160, and a driving member 180. A wafer W is placed on the blade member 120. The blade member 120 travels with the arm member 140 and is provided to be rotatable with respect to the arm member 140. The driving member 180 provides a driving force to the arm member 140 or the blade member 120.

The blade member 120 includes a top blade 120a and a bottom blade 120b, which enable two wafers W to be transferred at the same time. The bottom blade 120b is installed on the arm member 140. The top blade 120a is disposed over the bottom blade 120b. The top and bottom blades 120a and 120b are provided so that their relative positions are changeable. For example, the top and bottom blades 120a and 120b change their positions between a folded state where the top blade is vertically disposed over the bottom blade and an unfolded state where the top and bottom blades rotate oppositely at a preset angle. The top and bottom blades 120a and 120b of the folded state rotate at a preset angle in opposite directions to be converted to the unfolded state.

The top blade 120a includes a first support part 122, a second support part 124, and a connecting part 126. Each of the first and second support parts 122 and 124 is a portion on which a wafer W is placed, and the connecting part 126 connects the first and second parts 122 and 124 to each other. The connecting part 126 exhibits the shape of a rod. The first support part 122 extends from one end of the connecting part 126 in a length direction of the connecting part 126, and the second support part 124 extends from the other end of the connecting part 126 in the length direction of the connecting part 126. The first support part 122 exhibits the same shape as the second support part 124. The first and second support parts 122 and 124 may be provided with the shape of "C". While the bottom blade 120b roughly exhibits the same shape as the top blade 120a, a through-hole is formed at the central region of the connecting part 126 and a rotation shaft is inserted into the through-hole to rotate the top blade 120a.

The blade member 120 is provided on the arm member 140 to travel with the arm member 140. The arm member 140 includes a plurality of arms. In an exemplary embodiment, the arm member 140 includes a top arm 140a and a bottom arm 140b. The top arm 140a is disposed on the bottom arm 140b and provided to be rotatable thereon. Each of the top and bottom arms 140a and 140b exhibits the shape of a long rod. In the top and bottom arms 140a and 140b, formed is an empty space into which components of the driving member 180 are partly inserted. An aperture is formed at an upper wall of one end of the top arm 140a, and an aperture is formed at an upper wall of one end of the bottom arm 140b. The connecting part 126 is disposed on one end of the top arm 140a, and the other end of the top arm 140a is disposed on one end of the bottom arm 140b.

The rotation body 160 rotates and linearly moves the bottom arm 140b up and down. The rotation body 160 exhibits the shape of a tube in which an empty space is formed. An aperture is formed at an upper wall of the rotation body 160.

Figure 4:
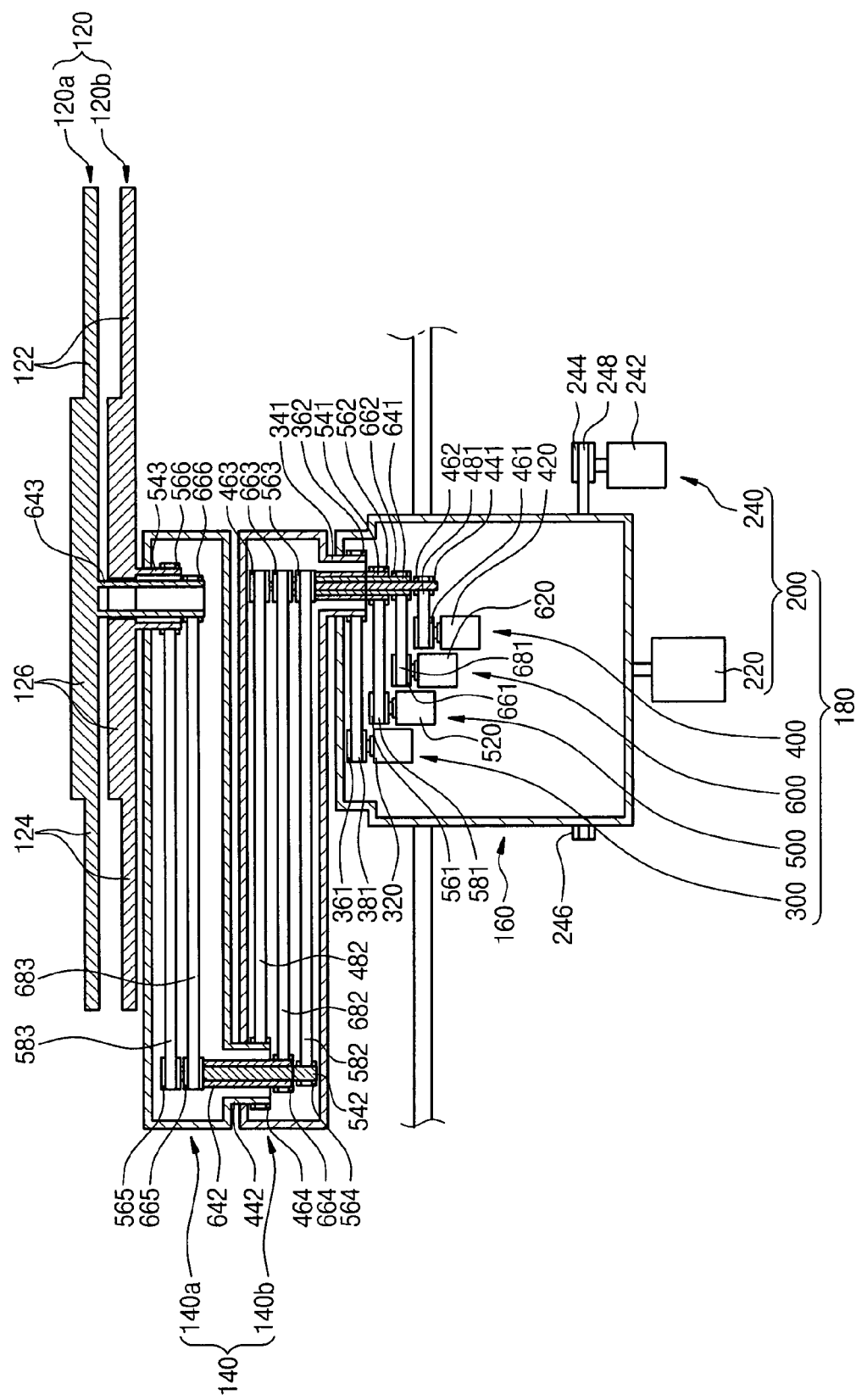
FIG. 4 is a cross-sectional view of the substrate transfer unit illustrated in FIG. 3.

The driving member 180 drives the rotation body 160, the arm member 140, and the blade member 120. As illustrated in FIG. 4, the driving member 180 includes a rotation body driver 200, a bottom arm driver 300, a top arm driver 400, a bottom blade driver 500, and a top blade driver 600. The rotation body driver 200 includes a vertical mover 220 linearly moving the rotation body 160 up and down and a rotation driver 240 rotating the rotation body 160. The rotation driver 240 includes a motor 242, a first pulley 244, a second pulley 246, and a belt 248. The first pulley 244 is connected to a motor 242, and the second pulley 246 is provided at the rotation body 160. The first and second pulleys 244 and 246 are connected to each other by the belt 248. A rotatory force of the motor 242 is transferred to the rotation body 160 through the first pulley 244, the belt 248, and the second pulley 246. The vertical mover 220 may be provided with an assembly structure including a cylinder.

The bottom arm driver 300 includes a motor 320, a rotation shaft 341, a first pulley 361, a second pulley 362, and a belt 381. The motor 320, the belt 381, the first pulley 361, and the second pulley 362 are disposed at a space in the rotation body 160. The rotation shaft 341 extends downwardly from a lower wall of the other end of the bottom arm 140b to be inserted into the space in the rotation body 160 through the aperture provided at the upper wall of the rotation body 160. The first pulley 361 is connected to the motor 320, and the second pulley 362 is provided at a lower end region of the rotation shaft 341. The belt 381 connects the first and second pulleys 361 and 362 to each other. A rotatory force of the motor 320 is transferred to the bottom arm 140b through the first pulley 361, the belt 381, the second pulley 362, and the rotation shaft 341.

The top arm driver 400 includes a motor 420, a first rotation shaft 441, a second rotation shaft 442, first to fourth pulleys 461-464, a first belt 481, and a second belt 482. The first rotation shaft 441 extends to a space in the rotation body 160 through the inside of the first rotation shaft 341 of the bottom arm driver 300 from the space in the bottom arm 140b. The second rotation shaft 442 extends downwardly from a lower wall of the other wall of the top arm 140a to be inserted into the space in the bottom arm 140b through the aperture provided at an upper wall of one end of the bottom arm 140b. The first pulley 461 is connected to the motor 420, and the second pulley 462 is provided at the bottom end of the first rotation shaft 441. The first and second pulleys 461 and 462 are connected to each other by the first belt 481. The third pulley 463 is provided at the top end of the first rotation shaft 441, and the fourth pulley 464 is provided at the bottom end of the second rotation shaft 442. The third and fourth pulleys 463 and 464 are connected by the second belt 482. A rotatory force of the motor 420 is transferred to the top arm 140a through the first pulley 461, the first belt 481, the second pulley 462, the first rotation shaft 441, the third pulley 463, the second belt 482, and the second rotation shaft 442.

The bottom blade driver 500 includes a motor 520, first to third rotation shafts 541-543, first to sixth pulleys 561-566, and first to third belts 581-583. The first rotation shaft 541 extends to the space in the rotation body 160 from the space in the bottom arm 140b through the inside of the first rotation shaft 341 of the bottom arm driver 300. The second rotation shaft 542 extends to the space in the bottom arm 140b from the space in the top arm 140a through the inside of the second rotation shaft 442 of the top arm driver 400. The third rotation shaft 543 extends downwardly from a lower wall of the connecting part 126 of the bottom blade 120b to be inserted into the space in the top arm 140a through the aperture provided at an upper wall of one end of the top arm 140a. The first pulley 561 is connected to the motor 520, and the second pulley is provided at the bottom end of the first rotation shaft 541. The first and second pulleys 561 and 562 are connected to each other by the first belt 581. The third pulley is provided at the top end of the first rotation shaft 541, and the fourth pulley 564 is provide at the bottom end of the second rotation shaft

542. The third and fourth pulleys 563 and 564 are connected to each other by the second belt 582. The fifth pulley 565 is provided at the top end of the second rotation shaft 542, and the sixth pulley 566 is provided at the bottom end of the third rotation shaft 543. The fifth and sixth pulleys 566 are connected to each other by the third belt 583. A rotatory force of the motor 520 is transferred to the bottom blade 120*b* through the first pulley 561, the first belt 581, the second pulley 562, the first rotation shaft 541, the third pulley 563, the second belt 582, the fourth pulley 564, the second rotation shaft 542, the fifth pulley 565, the third belt 583, and the third rotation shaft 543.

The top blade driver 600 includes a motor 620, first to third rotation shafts 641-643, first to sixth pulleys 661-666, and first to third belts 681-683. The first rotation shat 641 extends to the space in the rotation body 160 from the space in the bottom arm 140*b* through the inside of the first rotation shaft 641 of the bottom blade driver 500. The second rotation shaft 642 extends to the space in the bottom arm 140*b* from the space in the top arm 140*a* through the inside of the second rotation shaft 442 of the top arm driver 400. The third rotation shaft 643 extends downwardly to the space in the top arm 140*a* from a lower wall of the connecting part 126 of the top blade 120*a* through the through-hole provided at the bottom blade 120*b* and the inside of the third rotation shaft 543 of the bottom blade driver 500. The first pulley 661 is connected to the motor 620, and the second pulley 662 is provided at the bottom end of the first rotation shaft 641. The first and second pulleys 661 and 662 are connected to each other by the first belt 681. The third pulley 663 is provided at the top end of the first rotation body 641, and the fourth pulley 664 is provided at the bottom end of the second rotation shaft 642. The third and fourth pulleys 663 and 664 are connected to each other by the second belt 682. The fifth pulley 665 is provided at the top end of the second rotation shaft 642, and the sixth pulley 666 is provided at the bottom end of the third rotation shaft 643. The fifth and sixth pulleys 665 and 666 are connected to each other by the third belt 683. A rotatory force of the motor 620 is transferred to the top blade 120*a* through the first pulley 661, the first belt 681, the second pulley 662, the first rotation shaft 641, the third pulley 663, the second belt 682, the fourth pulley 664, the second rotation shaft 642, the fifth pulley 665, the third belt 683, the sixth pulley 666, and the third rotation shaft 643.

The first rotation shaft 541 of the bottom blade driver 500 is inserted into the first rotation shaft 341 of the bottom arm driver 300, both ends of the first rotation shaft 541 of the bottom blade driver 500 protrude from opposite ends of the first rotation shaft 341 of the bottom arm driver 600. The first rotation shaft 641 of the top blade driver 600 is inserted into the first rotation shaft 541 of the bottom blade driver 500, both ends of the first rotation shaft 641 of the top blade driver 600 further protrude from the opposite ends of the first rotation shaft 541 of the bottom blade driver 500. The second rotation shaft 542 of the bottom blade driver 500 is inserted into the second rotation shaft 542 of the top blade driver 600, both ends of the second rotation shaft 542 of the bottom blade driver 500 protrude from the opposite ends of the second rotation shaft 642 of the top blade driver 600.

While it is described in the foregoing configuration that "the bottom arm 140*b*, the top arm 140*a*, the bottom blade 120*b*, and the top blade 120*a* are independently driven by their respective drivers 300, 400, 500, and 600", the bottom arm 140 and the top arm 140*a* may gear with each other to be driven by one driver and the bottom blade 120*b* and the top blade 120*a* may gear with each other to be driven by one driver.

Figure 5:
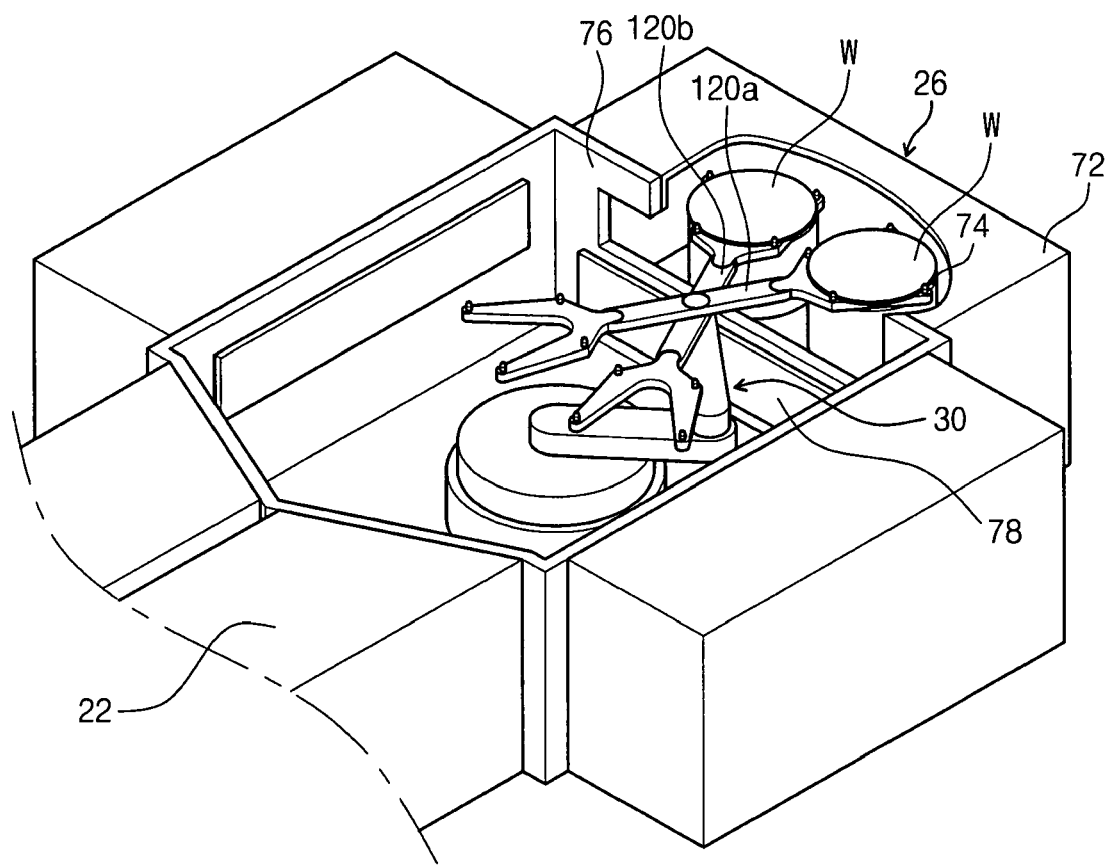
FIGS. 5 and 6 are perspective views showing unfolded and folded states of a substrate transfer unit, respectively.
Figure 6:
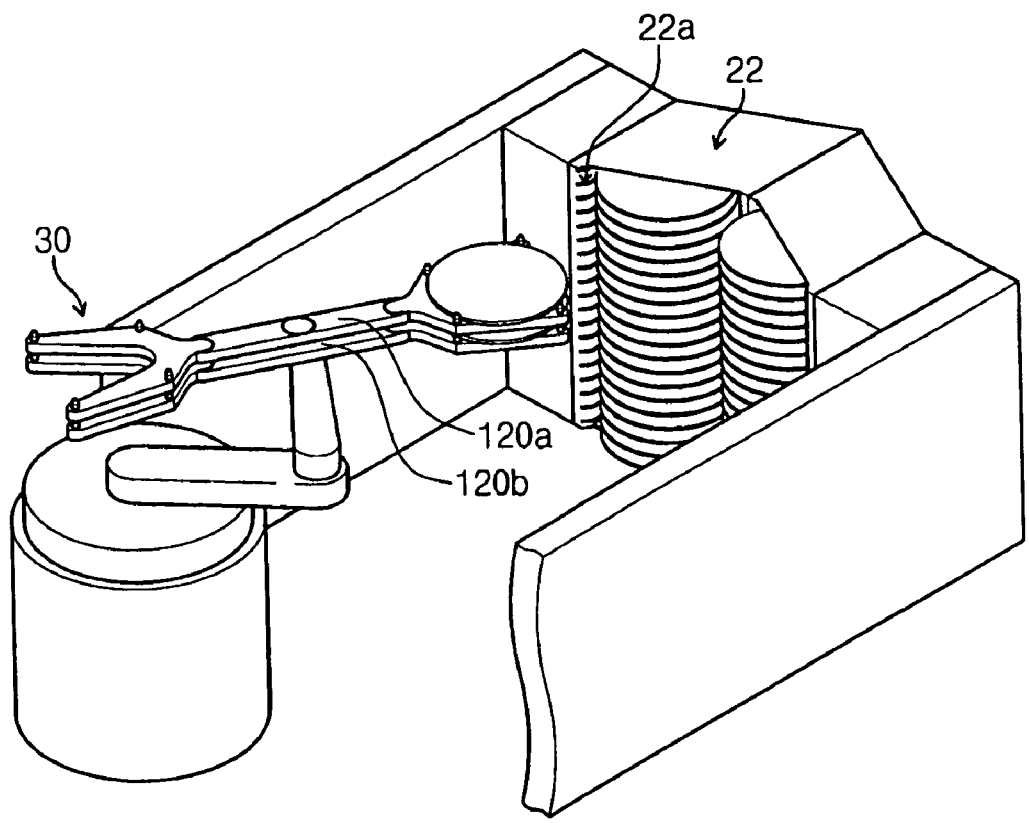

The blade member 120 is maintained at a folded state when wafers W are taken out of or put into a loadlock chamber 22 where the wafers W are stacked. The blade member 120 is maintained at an unfolded state when wafers W are taken out of or put into a process chamber 26 where the wafers W are horizontally placed. FIG. 5 shows that wafers W are put into the process chamber 26 under an unfolded state of the blade member 120, and FIG. 6 shows that wafers W are put into a loadlock chamber 22 under a folded sate of the blade member 120.

As described above, each of the top blade 120*a* and the bottom blade 120*b* has a first support part 122 and a second support part 124. Therefore, during a process for wafers W, the blade member 120 waits at a process chamber 26 in state that wafers W to be subjected to the next process are supported at their first support parts 122. When the process is completed inside the process chamber 26, the blade member 120 takes wafers W out of the process chamber 26 by using empty second support parts 124. Immediately after the bottom blade 120*b* and the top blade 120*a* rotate with respect to an arm member 140 at an angle of 180 degrees, the wafers W placed at the first support parts 122 are put into the process chamber 26. Thus, time required for placing new wafers W after taking wafers W out of the process chamber 26 is reduced to increase the treating amount of the process chamber 26.

A substrate treating method according to an embodiment of the present invention will now be described below. In this embodiment, two process chambers 26 are provided to sequentially perform a series of processes and two support members 74 are provided inside the respective process chambers 26.

Wafers W are stacked at a loadlock chamber 22 to be spaced apart from each other.

Figure 7:
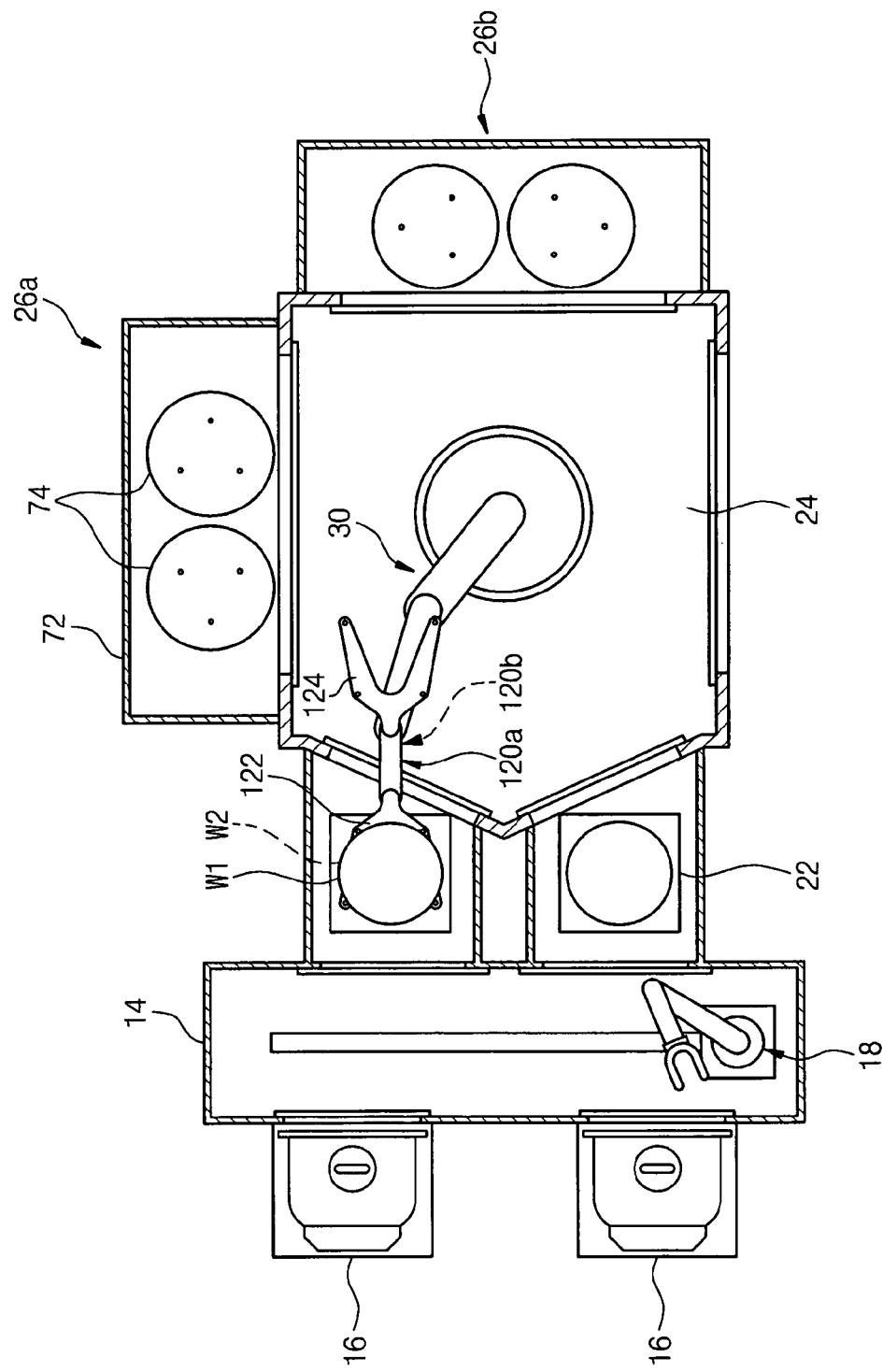
FIGS. 7 through 18 show the steps of transferring wafers during a substrate treatment.

Under a folded state, a blade member 120 takes a first wafer W1 and a second wafer W2 out of the loadlock chamber 22 by using the first support parts 122 (see FIG. 7).

Figure 8:
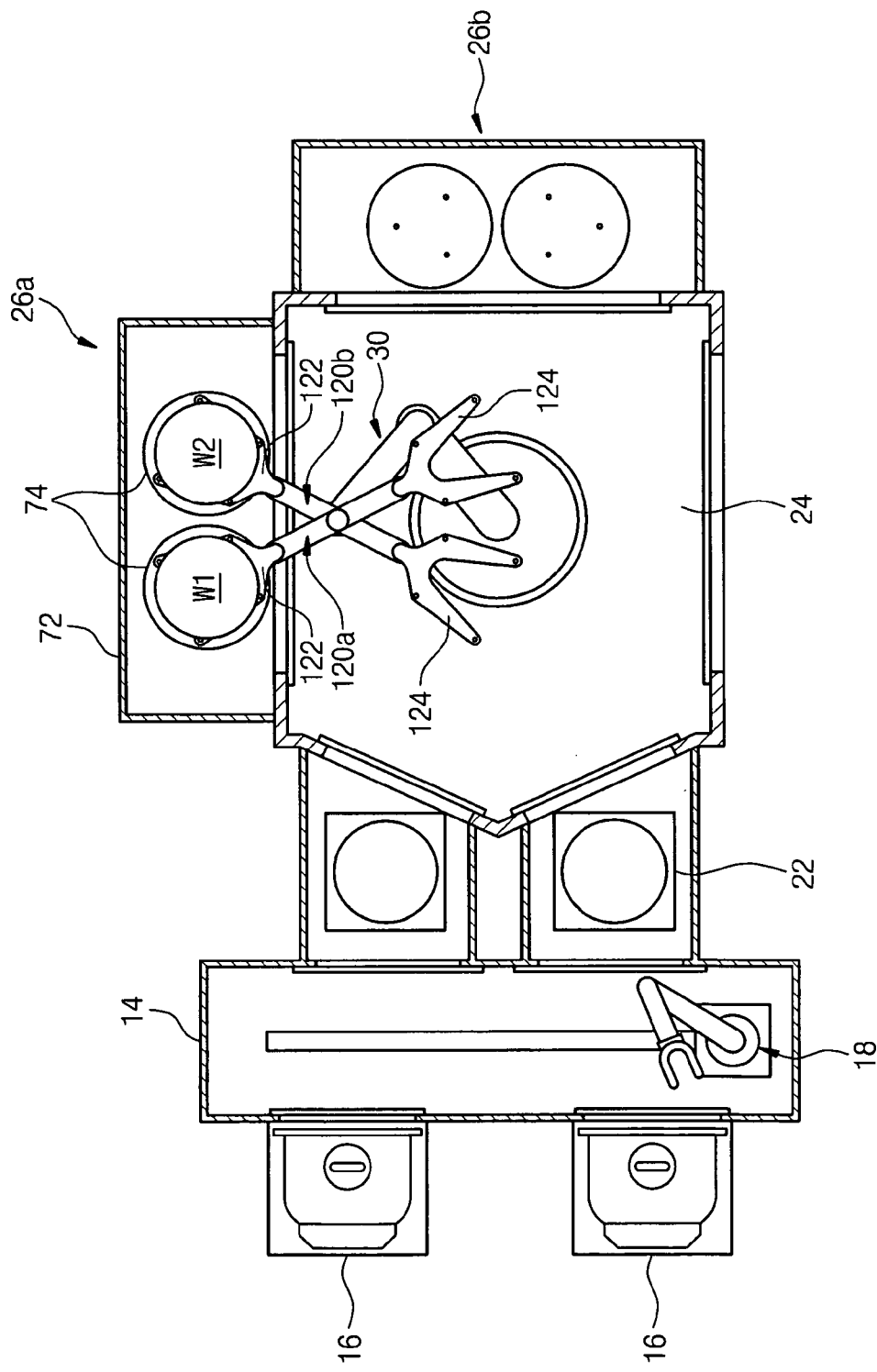

Under an unfolded state, a blade member 120 puts a first wafer W1 and a second wafer W2 into a first process chamber 26*a* by using the first support parts 122 (see FIG. 8).

Figure 9:
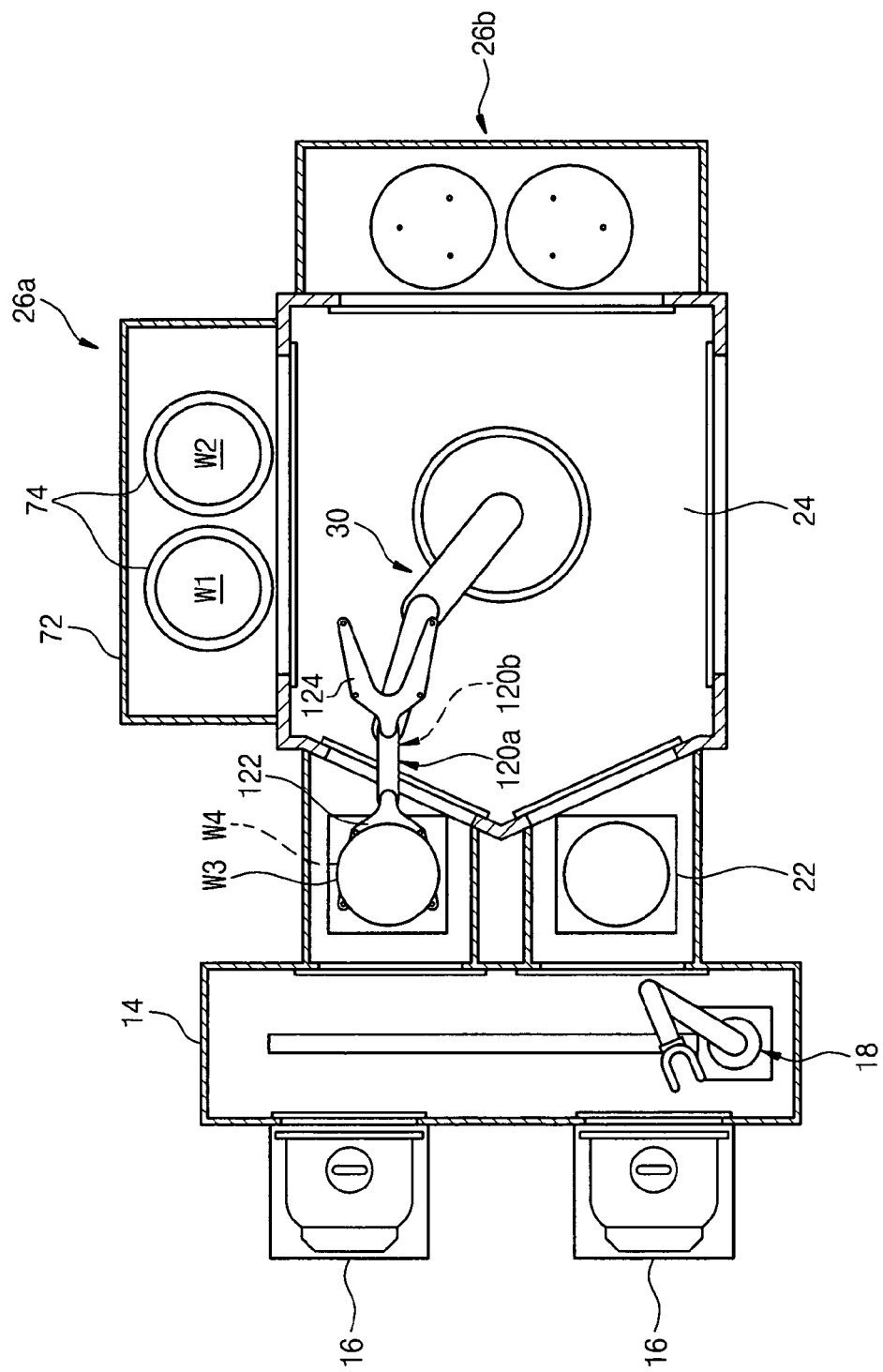

In the first process chamber 26*a*, a first process is performed for the first and second wafers W1 and W2. Under the folded state, the blade member 120 takes a third wafer W3 and a fourth wafer W4 out of the loadlock chamber 22 by using the first support parts 122 (see FIG. 9). The blade member 120 may take third and fourth wafers W3 and W4 out of the loadlock chamber 22 by using second support parts 124 instead of the first support parts 122.

Figure 10:
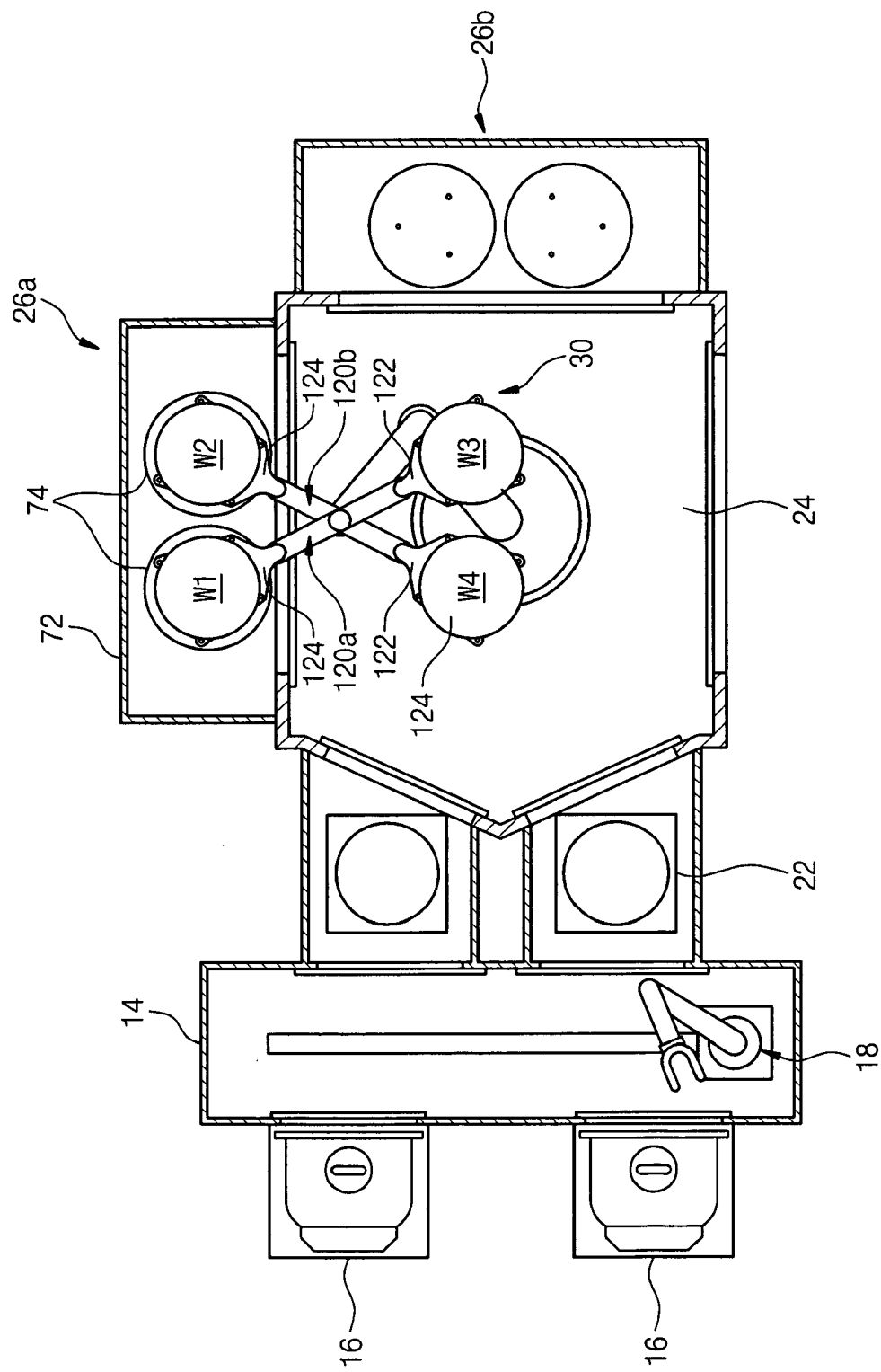

The blade member 120 waits at the first process chamber 26*a* until the process for the first and second wafers W1 and W2 are completed. When the process for the first and second wafers W1 and W2 is completed, the blade member 120 takes the first and second wafers W1 and W2 out of the first process chamber 26*a* by using the second support parts 124 (see FIG. 10).

Figure 11:
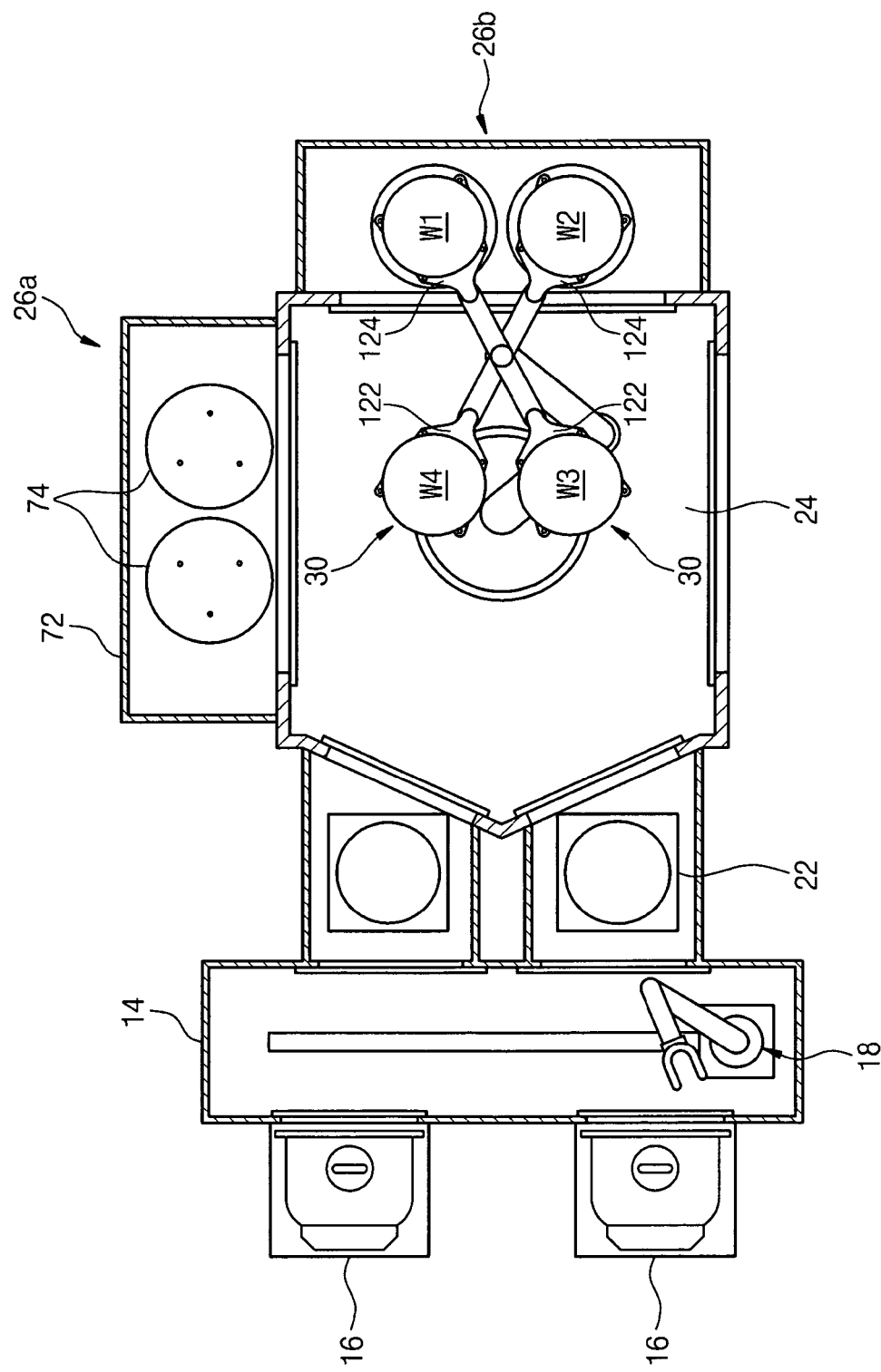

Under the unfolded state, the blade member 120 puts the first and second wafers W1 and W2 by using the second support parts 124 (see FIG. 11).

Figure 12:
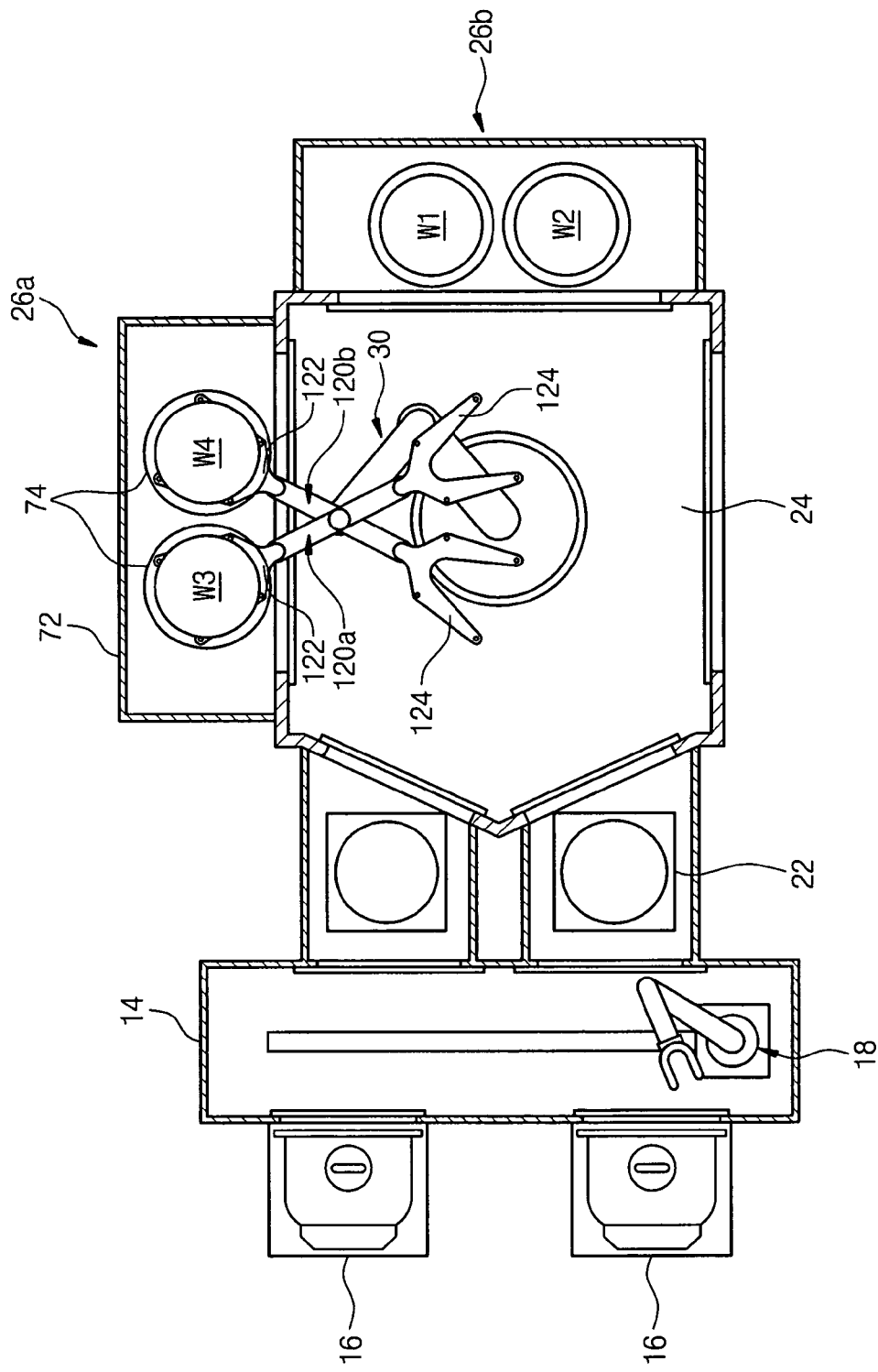

A process for a first wafer W1 and a second wafer W2 is performed in a second process chamber 26*b*. Under the unfolded state, the blade member 120 puts a third wafer W3 and a fourth wafer W4 into the first process chamber 26*a* (see FIG. 12).

Alternatively, the blade member 120 puts the first and second wafers W1 and W2 into the second process chamber 26*b* after putting the third and fourth wafers W3 and W4 into the first process chamber 26*a*.

Figure 13:
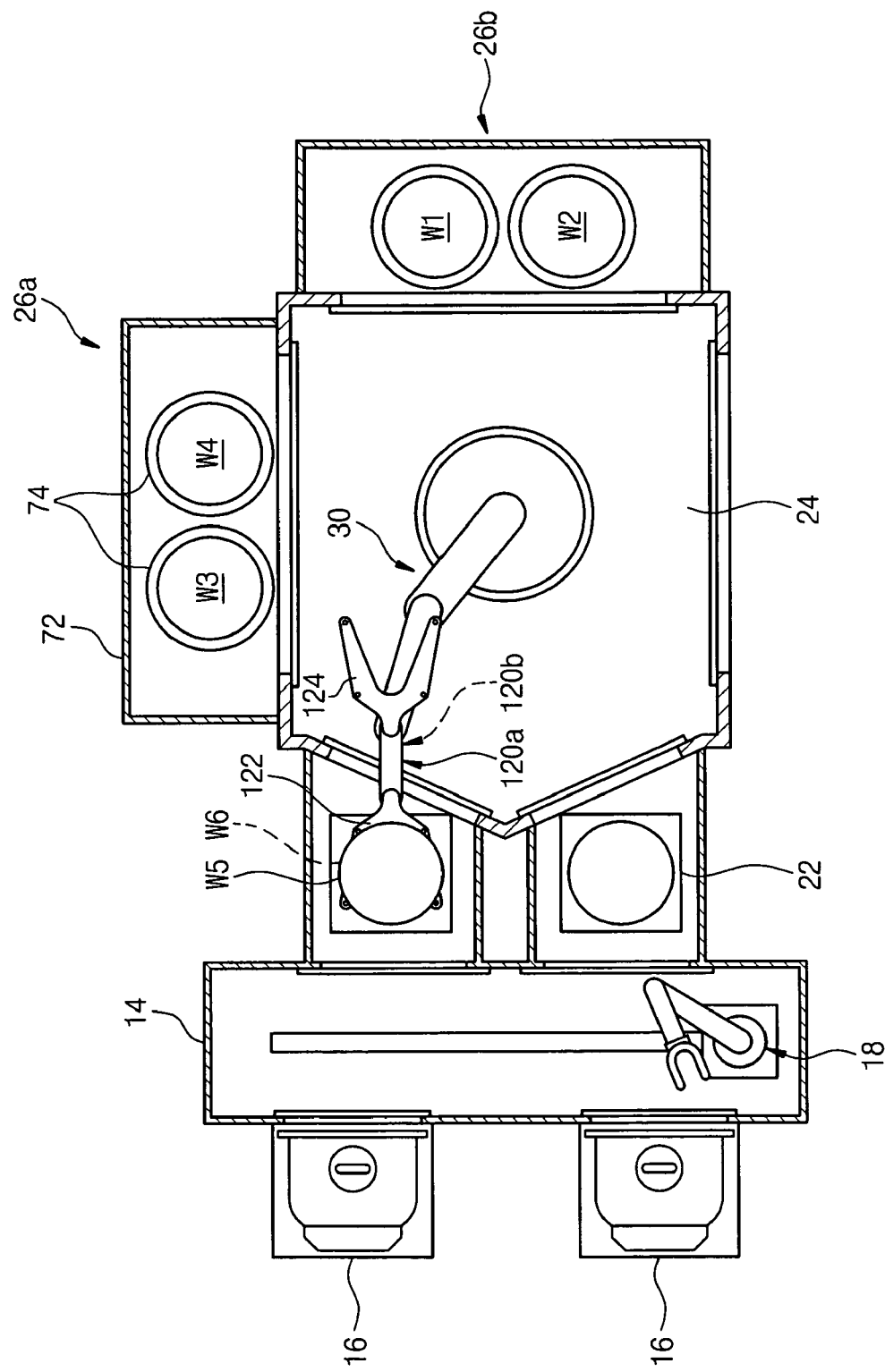

A process for the third and fourth wafers W3 and W4 is performed in the first process chamber 26a. Under a folded state, the blade member 120 takes a fifth wafer W5 and a sixth wafer W6 out of the loadlock chamber 22 by using the first support parts 122 (see FIG. 13).

Figure 14:
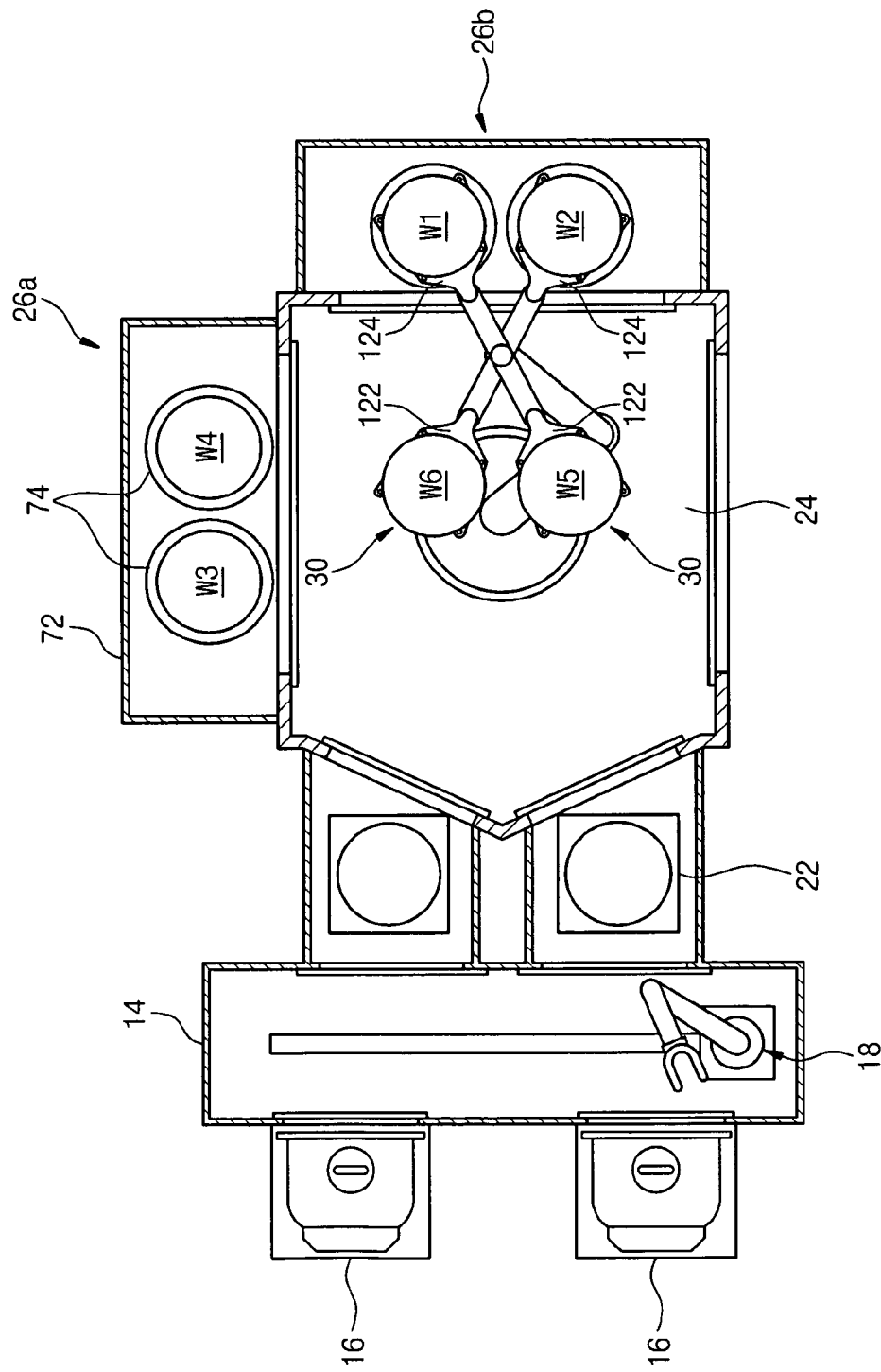

When the process for the first and second wafers W1 and W2 is completed in the second process chamber 26b, the blade member 120 takes the first and second wafers W1 and W2 out of the second process chamber 26b under the unfolded state by using the second support parts 124 (see FIG. 14).

Figure 15:
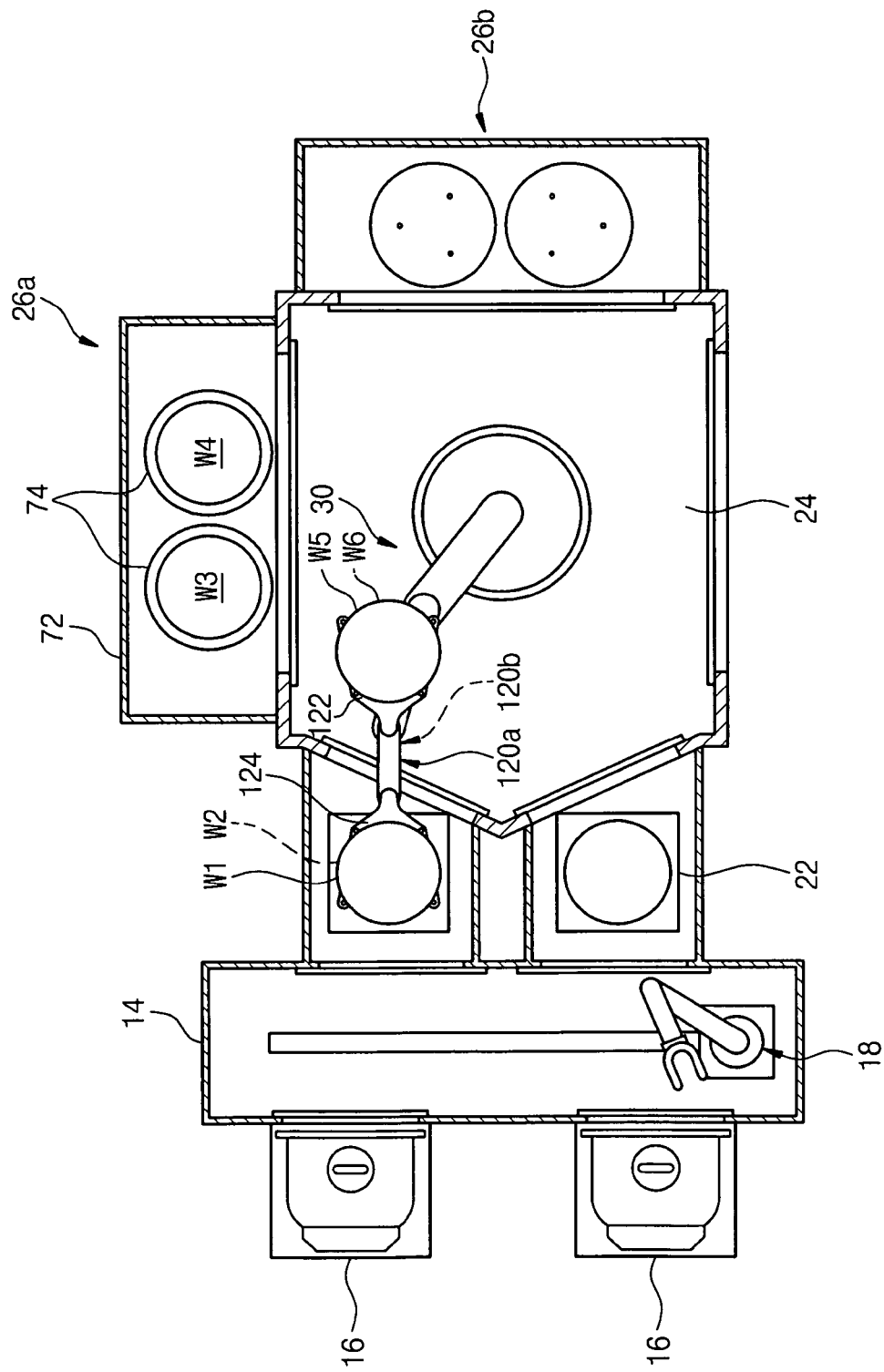

Under the folded state, the blade member 120 puts the first and second wafers W1 and W2 into the loadlock chamber 22 by using the second support parts 124 (see FIG. 15).

Figure 16:
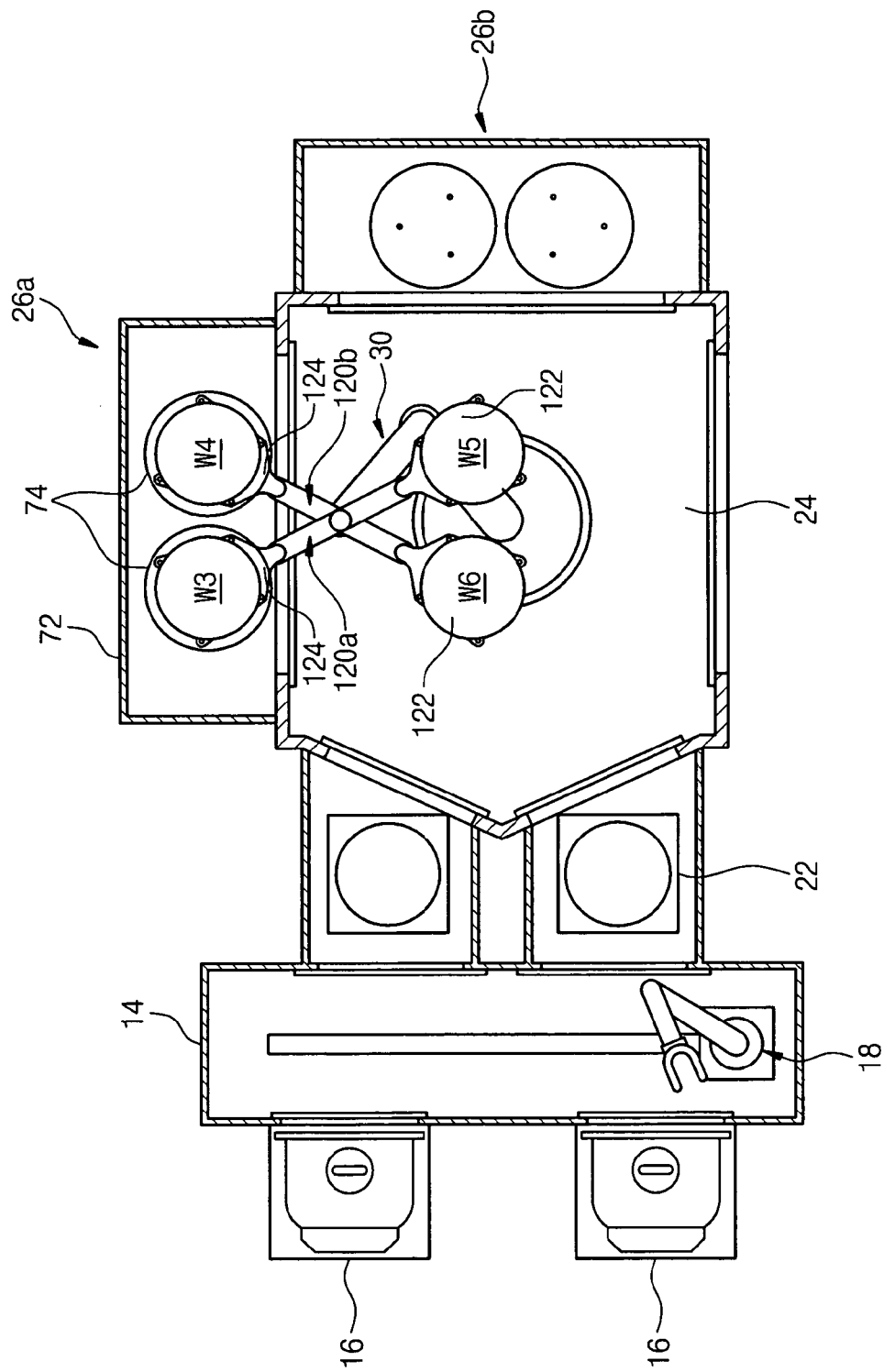

When the process for the third and fourth wafers W3 and W4 is completed in the first process chamber 26a, the blade member 120 takes the third and fourth wafers W3 and W4 under the unfolded state by using the second support parts 124 (see FIG. 16).

Figure 17:
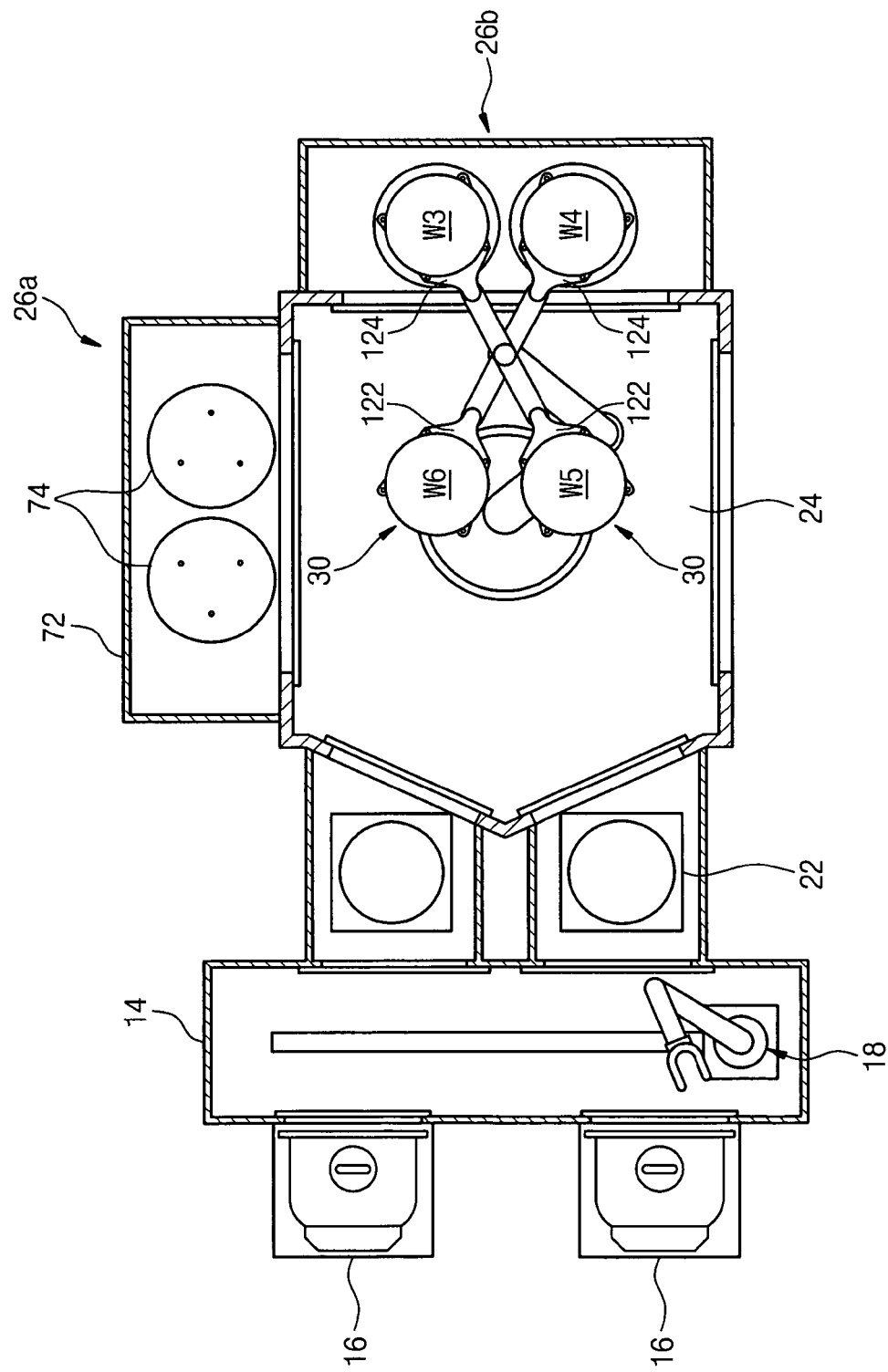

Under the unfolded state, the blade member 120 puts the third and fourth wafers W3 and W4 into the second process chamber 26b by using the second support parts 124 (see FIG. 17).

Figure 18:
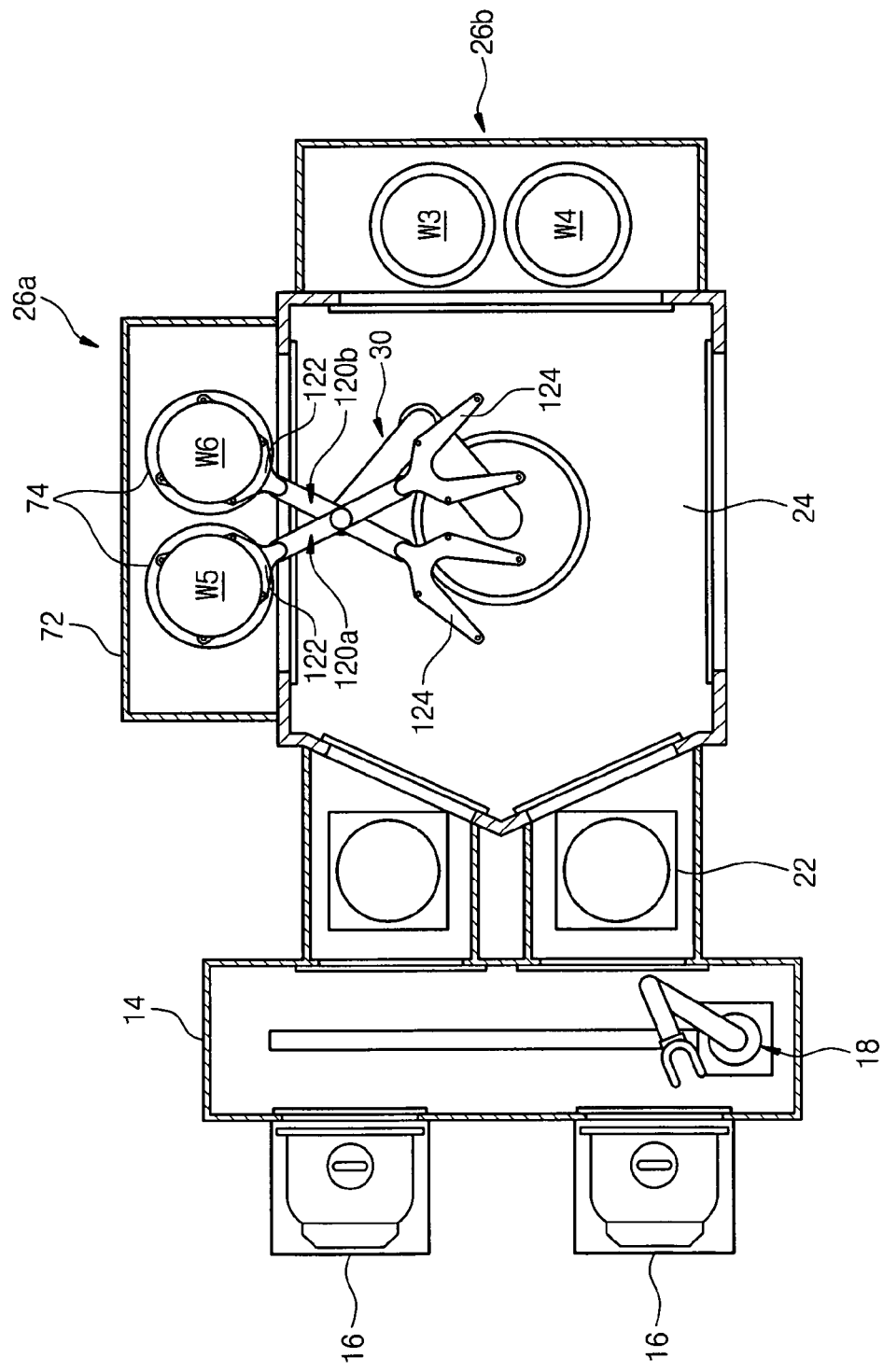

A process for the third and fourth wafers W3 and W4 is performed in the second process chamber 26b. Under the unfolded state, the blade member 120 puts the fifth and sixth wafers W5 and W6 into the first process chamber 26a by using the first support parts 122 (see FIG. 18).

Alternatively, the blade member 120 puts the third and fourth wafers W3 and W4 into the first process chamber 26a after putting the fifth and sixth wafers W5 and W6 into the first process chamber 26a.

A process for the fifth and sixth wafers W5 and W6 is performed in the first process chamber 26a, the blade member 120 takes new wafers W out of the loadlock chamber 22 and waits at the first process chamber 26a, and the above-described steps are repeated until processes for all wafers W is completed.

While a method for transferring wafers W at a cluster-type substrate treating apparatus has been described, the present invention may be applied to any structure where two wafers are simultaneously transferred between first support plates on which wafers W are stacked to be spaced apart from each other and second support plates on which wafers W are placed in a lateral direction. In this case, the first support plates correspond to the slot 22a provided at the loadlock chamber 22 and the second support plates correspond to support members. The method for transferring wafers W between the first support plates and the second support plates is similar to the method for transferring wafers W between the slot 22a in the loadlock chamber 22 and the support members 74 inside the process chamber 26 and will not be described in further detail.

As described so far, a substrate transfer unit can be converted to a folded state and an unfolded state. Thus, a transfer efficiency of wafers is significantly enhanced and an area occupied by the substrate transfer unit is reduced. In addition, each blade includes two support parts to put wafers into a process chamber immediately after taking the wafers out of the process chamber. Thus, the treating amount of the process chamber increases.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A method of treating substrates, comprising: treating a substrate by means of a substrate treating apparatus including
   a transfer chamber;
   supporting members disposed at one side of the transfer chamber, on which a substrate is placed;
   a loadlock chamber disposed at the other side of the transfer chamber; and
   a transfer unit provided at the transfer chamber to transfer substrates between the loadlock chamber and the supporting members,
   wherein substrates are placed inside the loadlock chamber to be vertically spaced apart from each other, and substrates are placed on the supporting members to be arranged abreast in a lateral direction,
   wherein the transfer unit comprises a top blade and a bottom blade converted to a folded state where they vertically face each other and an unfolded state where they rotate at a preset angle in opposite directions,
   wherein the transfer unit puts/takes two substrates into/out of the loadlock chamber at the same time under the folded state and puts/takes two substrates onto/out of the supporting members at the same time under the unfolded state, and
   wherein the top blade and the bottom blade are vertically spaced at a constant interval;
   wherein the top blade and the bottom blade include rotation shafts arranged at middle portions thereof about which the top blade and the bottom blade rotate so as to be in a folded or an unfolded position;
   wherein the rotation shaft of the top blade and the rotation shaft of the bottom blade enclose a same axis of rotation about which the top blade and the bottom blade rotate.

2. The method as recited in claim 1, wherein the top blade and the bottom blade comprise a first support part and a second support part disposed at their opposite ends, respectively, and wherein the transfer unit takes processed substrates out of the supporting member by using one of the first and second support parts while the other support part contains substrates to be processed on the supporting member.

3. The method as recited in claim 1, wherein the top blade and the bottom blade comprise a first support part and a second support part disposed at their opposite ends, respectively, and wherein the transfer unit takes substrates, to be processed on the supporting member, out of the loadlock chamber by using one of the first and second support parts, while the other support part contains processed substrates taken out of the supporting member.

4. The method as recited in claim 1, wherein the supporting members are placed inside one process chamber and arranged abreast in a lateral direction, wherein the process chamber is disposed at one side of the transfer chamber.

5. The method as recited in claim 1, wherein each one of the supporting members is placed in each one of process chambers, wherein the process chambers are disposed at one side of the transfer chamber and arranged abreast in a lateral direction.

6. The method as recited in claim 1, wherein the top blade and the bottom blade are coupled with one arm member.

7. The method as recited in claim 6, wherein the top blade and the bottom blade are selectively rotated on the arm member to be laid in the folded state or the unfolded state.

8. The method as recited in claim 1, wherein the rotation shaft of the top blade penetrates the rotation shaft of the bottom blade.

9. The method as recited in claim 1, wherein rotation shaft of the top blade and the rotation shaft of the bottom blade to do not translate with respect to one another.

10. A method of treating substrates, comprising:
vertically arranging a first plurality of substrates and a second plurality of substrates in a loadlock chamber;
arranging a plurality of blade members in a folded arrangement, the plurality of blade members including a plurality of first supports at first ends of the plurality of blade members and a plurality of second supports at second ends of the plurality of blade members;
loading the first plurality of substrates onto the plurality of first supports while the plurality of blade members is arranged in the folded arrangement;
unfolding the plurality of blade members with the first plurality of substrates loaded onto the plurality of first supports;
inserting the plurality of second supports into a first process chamber while the plurality of blade members are in an unfolded arrangement to load a third plurality of substrates on the plurality of second supports;
moving the plurality of second supports with the third plurality of substrates to a second process chamber while maintaining the plurality of blade members in an unfolded configuration and unloading the third plurality of wafers in the second process chamber while the plurality of blade members is in an unfolded arrangement;
moving the plurality of first supports with the first plurality of wafers to a third process chamber while maintaining the plurality of blade members in an unfolded arrangement and unloading the first plurality of wafers into the third process chamber while the plurality of blade members are in an unfolded arrangement;
arranging the plurality of blade members in the folded arrangement; and
loading the second plurality of substrates onto the plurality of second supports;
wherein the plurality of blade members includes a plurality of connecting parts connecting the plurality of first supports to the plurality of second supports;
wherein each connecting part includes a rotation shaft arranged near a middle thereof and the plurality of connection parts substantially enclose a same axis of rotation.

11. The method as recited in claim 10, wherein the third process chamber is the first process chamber.

12. A method of treating substrates, comprising:
vertically arranging a first plurality of substrates and a second plurality of substrates in a loadlock chamber;
arranging a first blade member and a second blade member in a folded configuration,
the first blade member including
a first connecting part having a first support part on a first end of the first connecting part, a second support part on a second end of the first connecting part, and a first rotation structure at a middle of the first connecting part about which the first connecting part rotates, and
the second blade member including
a second connecting part having a third support part at a first end of the second connecting part and a fourth support part at a second end of the second connecting part, and a second rotation structure at a middle of the second connecting part about which the second connecting part rotates;
loading the first plurality of wafers on the first and third support parts while the first blade member and the second blade member are in the folded configuration;
arranging the first and second blade members in an unfolded configuration; and
unloading the first plurality of wafers from the first and third support parts while the first blade member and the second blade member are arranged in the unfolded configuration;
wherein the first rotation structure is a first rotation shaft and the second the second rotation structure is a second rotation shaft and the first rotation shaft penetrates the second rotation shaft.

13. The method as recited in claim 12, wherein the first rotation structure and the second rotation structure enclose a same axis of rotation about which the first blade member and the second blade member rotate.

14. The method as recited in claim 12, wherein the first and second rotation structures do not translate with respect to one another.

* * * * *